(12) United States Patent
Ng

(10) Patent No.: US 12,068,627 B1
(45) Date of Patent: Aug. 20, 2024

(54) TECHNIQUES FOR REDUCING PULSE CURRENTS

(71) Applicant: Amazon Technologies, Inc., Seattle, WA (US)

(72) Inventor: Poh-Keong Ng, Medford, MA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 18/229,541

(22) Filed: Aug. 2, 2023

Related U.S. Application Data

(62) Division of application No. 16/894,240, filed on Jun. 5, 2020, now Pat. No. 11,721,997.

(51) Int. Cl.
*H02J 7/00* (2006.01)
*G01R 21/133* (2006.01)

(52) U.S. Cl.
CPC ............ *H02J 7/007* (2013.01); *H02J 7/0013* (2013.01); *H02J 7/0029* (2013.01); *G01R 21/133* (2013.01)

(58) Field of Classification Search
CPC ........ H02J 7/007; H02J 7/0029; H02J 7/0013; G01R 21/133
USPC ................... 320/134, 135, 140, 157
See application file for complete search history.

(56) References Cited

U.S. PATENT DOCUMENTS

| | | | |
|---|---|---|---|
| 8,878,505 B2 * | 11/2014 | Temkin | H02M 3/33523 323/283 |
| 9,117,106 B2 | 8/2015 | Dedeoglu et al. | |
| 9,235,928 B2 | 1/2016 | Medioni et al. | |
| 9,473,747 B2 | 10/2016 | Kobres et al. | |
| 10,218,264 B1 * | 2/2019 | Mcginty | H02M 1/15 |
| 11,721,997 B1 * | 8/2023 | Ng | H02J 7/0029 320/135 |
| 2006/0145670 A1 * | 7/2006 | Zhou | H02M 3/156 323/222 |
| 2007/0194759 A1 * | 8/2007 | Shimizu | H02J 7/345 320/166 |
| 2013/0284806 A1 | 10/2013 | Margalit | |
| 2022/0250487 A1 * | 8/2022 | Mao | H02J 7/02 |

OTHER PUBLICATIONS

Office Action for U.S. Appl. No. 16/894,240, mailed on Nov. 25, 2022, Ng, "Techniques for Reducing Pulse Currents", 6 pages.

* cited by examiner

*Primary Examiner* — Edward Tso
*Assistant Examiner* — Aaron Piggush
(74) *Attorney, Agent, or Firm* — Lee & Hayes, P.C.

(57) ABSTRACT

This disclosure describes, in part, techniques for reducing pulsating currents of internal power sources, such as batteries. For example, a device may include a power source, a load, and a control device located between the power source and the load. The control device may include a power converter that is configured to maintain a constant input current from the power source and output a pulsating current to the load. While regulating the power, the control device may determine whether an average output power is different than a reference power. If the average output power is equal to the reference power, then the control device may cause the power converter to maintain the constant input current. However, if the average output power is different than the reference power, then the control device may cause the power converter to alter (e.g., decrease/increase) the input current being received from the power source.

20 Claims, 7 Drawing Sheets

TECHNIQUES FOR REDUCING PULSE CURRENTS

RELATED APPLICATIONS

This application is a divisional of and claims priority to U.S. patent application Ser. No. 16/894,240, filed Jun. 5, 2020, titled "TECHNIQUES FOR REDUCING PULSE CURRENTS," the entirety of which is incorporated herein by reference.

BACKGROUND

In devices, batteries may output pulsating currents in order to provide the power required for certain components included within the devices. For example, if a device includes a light that is activated at a given frequency, then a battery may output a pulsating current that is based on the given frequency of the light. Problems can occur for devices that require these pulsating currents in order to provide the required power to components. For instance, a device that requires a pulsating current will need a battery that is rated high enough to output the required peak current, this is even though the average current is much less. Additionally, pulsating the current can reduce the life the battery.

BRIEF DESCRIPTION OF FIGURES

The detailed description is set forth with reference to the accompanying figures. In the figures, the left-most digit(s) of a reference number identifies the figure in which the reference number first appears. The use of the same reference numbers in different figures indicates similar or identical items or features.

DETAILED DESCRIPTION

Figure 1:
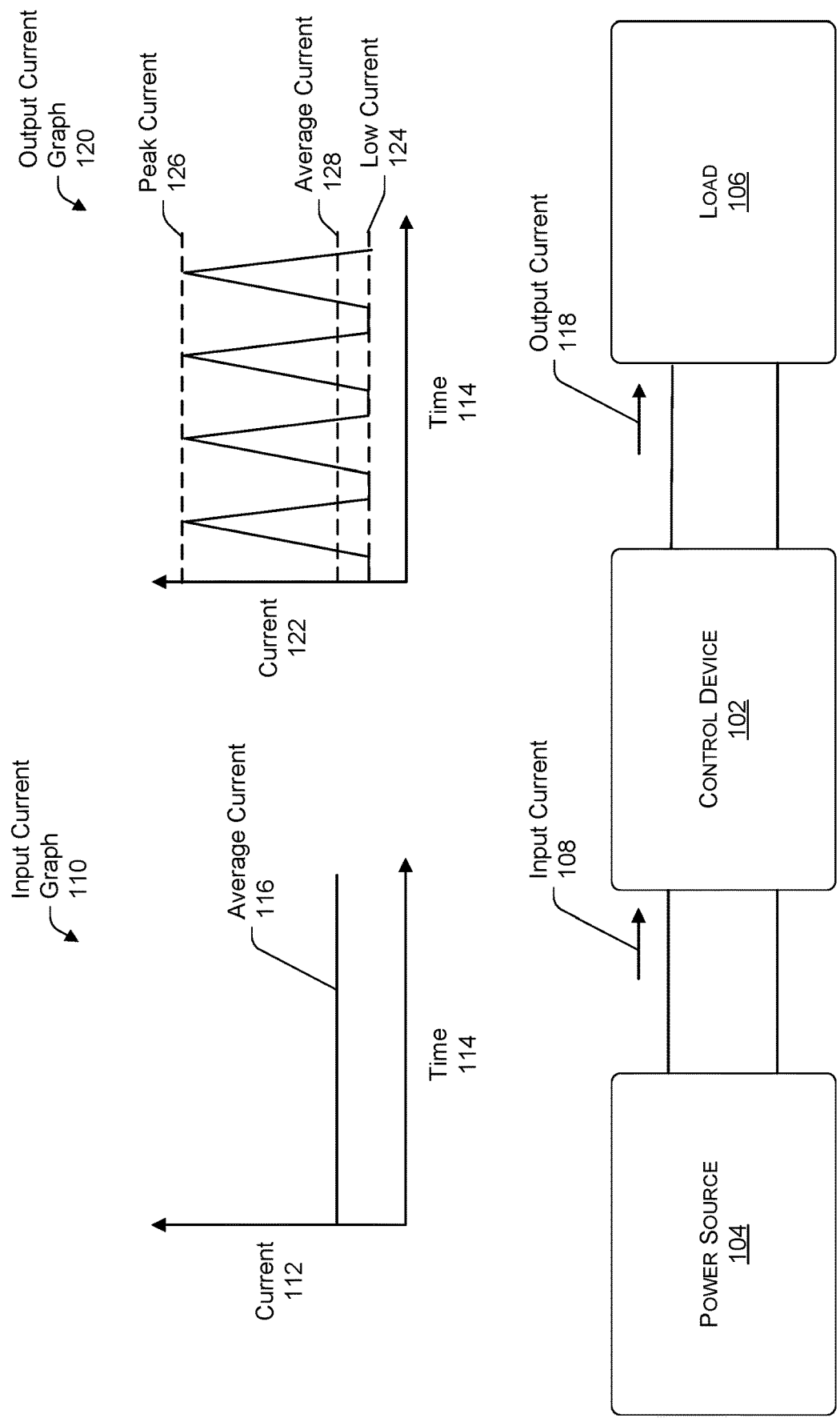
FIG. 1 illustrates an example of using a control device to regulate power between a power source and a load, according to various examples of the present disclosure.

This disclosure describes, in part, techniques for reducing pulse currents that are output by power sources. For example, a device may include the power source, a load, and a control device located between the power source and the load. The control device may include a power converter that is configured to maintain a constant input current from the power source and output a pulsating current to the load. In some instances, the average power being output by the power converter may be approximately equal to the average power being received by the power converter. While the power converter is regulating the power, the control device may determine whether the output power being transmitted by the power converter is different than a reference power. If the output power is equal to the reference power, then the control device may cause the power converter to maintain the constant input current. However, if the output power is different than the reference power, then the control device may alter (e.g., decrease or increase) the input current being received from the power source.

For more details, the power converter may include a buck converter, a boost converter, a bust-boost converter, an isolated topology, and/or any other hardware device that is capable of converting power. For a first example, if the voltage of the power source is less than the voltage required by the load, then the power converter may include a boost converter and/or bust-buck converter. For a second example, if the voltage of the power source is greater than the voltage required by the load, then the power converter may include a buck converter and/or bust-boost converter. Still, for a third example, if the voltage of the power source is greater than the voltage required by the load during certain periods of time and less than the voltage required by the load during other periods of time, then the power converter may include a bust-boost converter.

The power source may include an external power source, such as a power outlet, or an internal power source, such as one or more batteries. Additionally, the load may include light(s), a camera, a receiver, and/or any other component that may be included within an electronic device. In some examples, the power converter is located closer to the load than the power source. In some examples, the power converter is located within the load. In either of the examples, the power converter may be located proximate to and/or within the load in order to reduce the amount of large gauge wires that are required for transmitting the output power (e.g., the peak current) from the power converter to the load.

The control device may be configured to maintain that an input current from the power source remains approximately constant. Additionally, because of the power required by the load, the output current from the power converter may pulsate at a given frequency. In some examples, the given frequency is based on the type of load and/or the power requirements of the load. For example, the given frequency may include, but is not limited to, 1 Hz, 1 kHz, 1 MHz, and/or the like. In some instances, the control device may also be configured to cause the average of the output power transmitted by the power converter may be approximately equal to the average of the input power being received by the power converter. In some examples, the average of the output power is approximately equal to the average of the input power when the average of the output power is within a given percentage (e.g., 1%, 2%, 5%, etc.) to the average of the input power. Additionally, or alternatively, in some examples, the average of the output power is approximately equal to the average of the input power when the average of the output power is within a given number of units (e.g., 0.01 w, 0.1 w, 1 w, etc.) to the average of the input power.

The power converter may be configured to charge using the input power from the power source. For example, during the charging, the output voltage of the power converter will continue to increase using the input power (e.g., the input current) from the power source. Once the load is turned on, the power converter will discharge the peak output current to the load. As a result, the output voltage of the power converter will once again drop to a minimum. After dropping, and when the load is again turned off, the power converter will again begin to charge using the input power (e.g., the input current) from the power source until the load is again turned on. As a result, and in some examples, the output voltage of the power converter may be similar to a sawtooth waveform.

The control device may be configured to determine a reference power. In some instances, the control device determines the reference power by receiving data representing the reference power. The control device may then be configured to maintain that the output power that is transmitted by the power converter is approximately equal to the reference power over periods of time (e.g., over different cycles of the power converter). In some instances, the output power is approximately equal to the reference power when the output power is within a given percentage (e.g., 1%, 2%, 5%, etc.) to the reference power over the periods of time. Additionally, or alternatively, in some instances, the output power is approximately equal to the reference power when the output power is within a given number of units (e.g., 1 W, 5 W, 10 W etc.) to the reference power over the periods of time.

For example, to maintain that the output power is approximately equal to the reference power over a period of time, the control device may include a voltage reader that determines an output voltage over the period of time and a current reader that determines an output current over the first period of time. The control device may then determine am average output voltage and an average output current over the period of time. In some instances, the control device determines the average output voltage and/or the average output current using one or more hardware components. The control device may then use the average output voltage and the average output current to determine an average output power over the period of time. For example, the control device may determine the average output power by multiplying the average output voltage by the average output current.

The control device may then compare the average output power to the reference power. Based on the comparison, the control device may determine if the average output power is less than the reference power, equal to the reference power, or greater than the reference power. The control device uses this determination to determine whether to alter the input current being received by the power converter. For example, if the control device determines that the average output power is less than the reference power, then the control device may cause the input current being received by the power converter to increase by a given amount. Additionally, if the control device determines that the average output power is equal to the reference power, then the control device may cause the input current to remain constant. Furthermore, if the control device determines that the average output power is greater than the reference power, then the control device may cause the input current being received by the power converter to decrease by a given amount.

In some examples, the given amount that the control device causes the input current to decrease/increase may be constant. In other examples, the given amount that the control device causes the input current to decrease/increase may be based on one or more factors. For instance, the given amount may be based on the difference between the average output power and the reference power. For example, if the difference between the average output power and the reference power is small, then the control device may cause the input current to decrease/increase by a first amount. However, if the difference between the average output power and the reference power is large, then the control device may cause the input current to decrease/increase by a second, larger amount.

By performing the processes described above, the control device may cause the average output current to get closer to and/or be the same as the reference power. For a first example, if the control device causes the input current to increase because the average output power was less than the reference power, then the increase in the input current will also cause an increase to the output current and/or an increase to the output voltage. As a result, the average output power will also increase, thus bringing the average output power closer to the reference power.

For a second example, if the control device causes the input current to decrease because the average output power was greater than the reference power, then the decrease in the input current will also cause a decrease to the average output current and/or a decrease to the average output voltage. As a result, the average output power will also decrease, thus bringing the average output power closer to the reference power. Still, and for a third example, if the control device causes the input current to remain constant because the average output power was equal to the reference power, then the input current will also cause the average output current and the average output voltage to remain constant. As a result, the average output power will also remain constant, thus keeping the average output power to be equal to the reference power.

The control device will continue to perform these processes in order to maintain that the output power is approximately equal to the reference power. For example, and for a second, subsequent period of time, the control device again determines the average output power over the second period of time and compares the average output power to the reference power. If the control device determines that the average output power is now equal to the reference power, then the control device may cause the input current to remain constant for a third, subsequent period of time. However, if the control device determines that the average output power is still different than the reference power, then the control device may again alter (e.g., decrease or increase) the input current that is received by the power converter for the third period of time.

In some examples, the control device uses constant periods of time when performing the processes described above. Additionally, or alternatively, in some examples, the control device may change one or more of the periods of time when performing the processes described above. For example, if the difference between the average output power and the reference power is large, and if the control device wants to quickly cause the average output power to equal the reference power, then the control device may decrease the period of time. This way, the control device is able to more quickly make the adjustments needed in order to cause the average output power to equal the reference power. As described herein, a period of time may include, but is not limited to, 1 millisecond, 1 second, 2 seconds, and/or any other period of time.

In some examples, the reference power used by the control device may remain constant. However, in other examples, the reference power used by the control device may be updated based on one or more factors. For example, if the load suddenly needs more power to operate as intended, then the reference power may increase to reflect the need for more power. In some instances, the control device may determine the updated reference power based on the power converter suddenly outputting a greater amount of power to the load. For example, if the average output power suddenly increases by a threshold amount, then the control device may determine to increase the reference power to be approximately equal to the average output power. In some examples, the average output power changes (e.g., increases or decreases) by the threshold amount when the average output power changes by a threshold percentage (e.g., 1%, 5%, 10%, etc.). Additionally, or alternatively, in some examples, the average output power changes by the threshold amount when the average output power changes by a given amount (e.g., 1 mA, 10 mA, 50 mA, etc.).

In some instances, in addition to, or alternatively from, determining the updated reference power using the average output power, the control device may receive data representing the updated reference power. For example, if an electronic device determines that the required power for the load to operate is about to change, then the control device may receive, from the electronic device, the data representing the updated reference power. This way, the control device may begin to alter the input current, before the change in the required power, so that the power converter is ready to provide the required power when the change occurs.

FIG. 1 illustrates an example of using a control device 102 to regulate power between a power source 104 and a load 106, according to various examples of the present disclosure. In the example of FIG. 1, the power source 104 may include an external power source, such as a power outlet, or an internal power source, such as one or more batteries. Additionally, the load 106 may include light(s), a camera, a receiver, and/or any other type of component that may be included in an electronic device. In the example of FIG. 1, the control device 102 may be configured to regulate the input power (e.g., input current) that is received from the power source 104 and the output power that is transmitted by the load 106.

For example, the control device 102 may include a power converter that is configured to operate as a current source by maintaining that an input current 108 received from the power source 104 remains approximately constant. This is illustrated by a first graph 110, which illustrates a current 112 over a period of time 114. As shown, an average current 116 associated with the input current 108 is approximately constant. Additionally, output current 118 from the power converter is pulsated because of the power required the load 106 by the load. This is shown by a second graph 120, which also illustrates current 122 over the period of time 114. As shown, the output current 118 is associated with both a low current 124 and a peak current 126. As also shown, an average current 128 associated with the output current 118 is approximately equal to the average current 116 associated with the input current 108.

The control device 102 may be configured to maintain that the output power transmitted by the power converter is approximately equal to a reference power over a period of time. To maintain that the output power is approximately equal to the reference power, the control device 102 may determine the average output voltage and the average output current 128 over the period of time. The control device 102 may then use the average output voltage and the average output current 128 to determine the average output power over the period of time. For example, the control device 102 may determine the average output power by multiplying the average output voltage by the average output current 128.

The control device 102 may then compare the average output power to the reference power. Based on the comparison, the control device 102 may determine if the average output power is less than the reference power, equal to the reference power, or greater than the reference power. If the control device 102 determines that the average output power is equal to the reference power, then the control device may cause the input current 108 to remain approximately constant. By causing the input current 108 to remain approximately constant, the control device 102 causes the average output current 128 and/or the average output voltage to also remain approximately constant. As a result, the average output power will remain equal to (and/or approximately equal to) the reference current.

However, if the control device 102 determines that the average output power is less than the reference power, then the control device 102 may cause the input current 108 being received by the power converter to increase by a given amount. By increasing the input current 108, the control device 102 is also causing the average output current 128 and/or the average output voltage to increase. As a result, the average output power also increases and gets closer to the reference power. Additionally, if the control device 102 determines that the average output power is greater than the reference power, then the control device 102 may cause the input current 108 being received by the power converter to decrease by a given amount. By decreasing the input current 108, the control device 102 is also causing the average output current 128 and/or the average output voltage to decrease. As a result, the average output power also decreases and gets closer to the reference power.

The control device 102 will continue to perform these processes in order to maintain that the average output power is approximately equal to the reference power. For example, at the expiration of another period of time, the control device 102 again determines the average output power over the period of time and compares the average output power to the reference power. If the control device 102 determines that the average output power is now equal to the reference power, then the control device 102 may cause the input current 108 to remain constant. However, if the control device 102 determines that the average output power is different than the reference power, then the control device 102 may alter (e.g., decrease or increase) the input current 108 that is received by the power converter for the next period of time. The control device 102 may continue to alter the input current 108, over one or more periods of time, until the average output power is approximately equal to the reference power.

Figure 2:
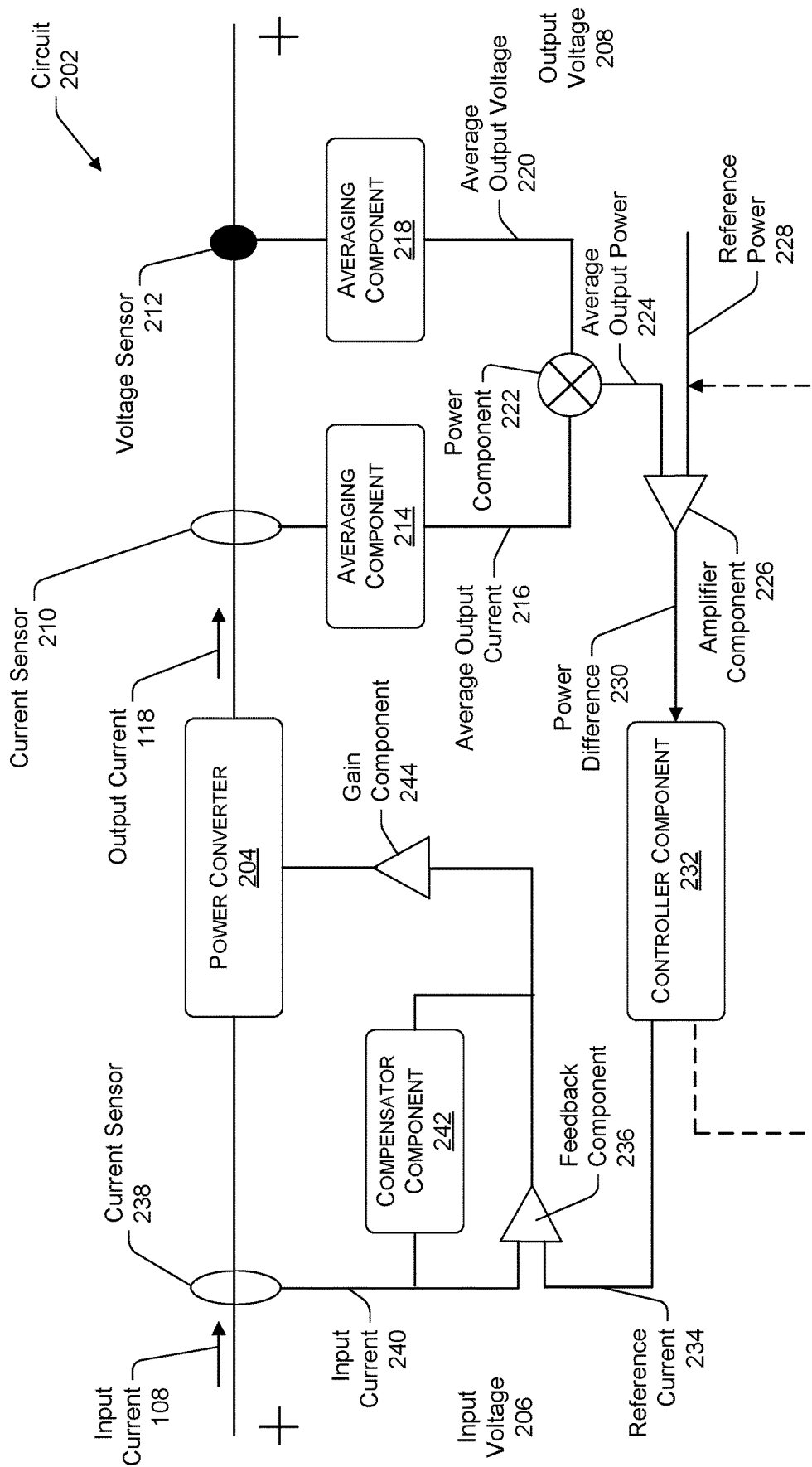
FIG. 2 illustrates an example circuit that may be included within the control device from the example of FIG. 1, according to various examples of the present disclosure.

FIG. 2 illustrates an example circuit 202 that may be included within the control device 102 from the example of FIG. 1, according to various examples of the present disclosure. As shown, the circuit 202 may include at least a power converter 204 that receives the input current 108 from the power source 104 and outputs the output current 118 to the load 106. The power converter 204 may include, but is not limited to, a buck converter, a boost converter, a bust-boost converter, an isolated topology, and/or any other hardware device that is capable of converting power. In some instances, the type of power converter 204 is selected based on the power source 104 and/or the load 106.

For a first example, if input voltage 206 from the power source 104 is less than output voltage 208 required by the load 106, then the power converter 204 may include a device that steps up the voltage (e.g., a boost converter, bust-buck converter, etc.). For a second example, if the input voltage 206 from the power source 104 is greater than the output voltage 208 required by the load 106, then the power converter 204 may include a device that steps down the voltage (e.g., a buck converter, a bust-boost converter, etc.). Still, for a third example, if the input voltage 206 from the power source 104 is greater than the output voltage 208 required by the load 106 during certain periods of time and less than the output voltage 208 required by the load 106 during other period of time, then the power converter 204 may include a device that is capable of both stepping up current and stepping down current (e.g., a bust-boost converter, etc.).

The circuit 202 further includes a current sensor 210 and a voltage sensor 212 located on the electronical connection between the power converter 204 and the load 106. The current sensor 210 may be configured to detect the output current 118 within the electronic connection with the load 106. The current sensor 210 may then be configured to generate signals that represent the output current 118 and send the signals to a first averaging component 214. Using the output signals from the current sensor 210, the first averaging component 214 is configured to determine an average output current 216 over a period of time. In some examples, the period of time may be static. However, in other examples, the period of time may be dynamic.

The voltage sensor 212 may be configured to detect the output voltage 208 within the electronic connection with the load 106. The voltage sensor 212 may then be configured to generate signals that represent the output voltage 208 and send the signals to a second averaging component 218. Using the output signals from the voltage sensor 212, the second averaging component 218 is configured to determine an average output voltage 220 over a period of time. In some examples, the periods of time used by the first averaging component 214 are the same as the periods of time used by the second averaging component 218. However, in other examples, the periods of time used by the first averaging component 214 are different than the periods of time used by the second averaging component 218.

The circuit 202 may also include a power component 222 that is configured to determine an average output power 224. In some instances, the power component 222 may include a multiplier such as, but not limited to, a binary multiplier, an analog multiplier, and/or any other type of multiplier that is capable of determining the average output power 224. To determine the average output power 224, the power component 222 receives signals indicating the average output currents 216 from the first averaging component 214 and signals indicating the average output voltages 220 from the second averaging component 218. The power component 222 may then determine an average output power 224 using the signals. For example, the power component 222 may be configured to multiply the average output current 216 by the average output voltage 220 to determine the average output power 224. In some examples, the power component 222 determines the average output power 224 over the same period of time as the averaging components 214, 218. In other examples, the power component 222 determines the average output power 224 over different periods of time.

The circuit 202 may also include an amplifier component 226 that receives signals indicating the average output power 224 from the power component 222. Additionally, the amplifier component 226 may receive signals indicating a reference power 228 for the circuit 202. The amplifier component 226 may then compare the average output power 224 to the reference power 228. Based on the comparison, the amplifier component 226 may determine a power difference 230, which represents a difference between the average output power 224 and the reference power 228. For a first example, if the average output power 224 (e.g., 100 W) is greater than the reference power 228 (e.g., 75 W), then the amplifier component 226 may determine that the power difference 230 is positive (e.g., 25 W). For a second example, if the average output power 224 (e.g., 100 W) is less than the reference power 228 (e.g., 125 W), then the amplifier component 226 may determine that the power difference 230 is negative (e.g., −25 W). Still, for a third example, if the average output power 224 (e.g., 100 W) is equal to the reference power 228 (e.g., 100 W), then the amplifier component 226 may determine that the power difference 230 is zero (e.g., 0 W).

In some instances, the amplifier component 226 may include (and/or be replaced by) a comparator. In such instances, the comparator may determine if the average output power 226 is greater to or less than the reference power 228. The comparator may then output the power difference 230 indicating whether the average output power 226 is greater than the reference power 228 or whether the average output power 226 is less than the reference power 228. In some instances, the power difference 230 may then include a digital value, such as 0 or 1, where 0 indicates that the average output power 226 is less than or greater to the reference power 228 and 1 indicates that the average output power 226 is less than or greater to the reference power 228.

The circuit 202 may further include a controller component 232 that is configured to determine a reference current 234 based at least in part on the power difference 230. In some instances, the controller component 232 determines the reference current 234 using at least a previous reference current 234. For a first example, if the power difference 230 is equal to zero, then the controller component 232 may determine that the new reference current 234 is to include the previous reference current 234. For a second example, if the power difference 230 is positive, then the controller component 232 may increase the previous reference current 234 by a given value in order to determine the new reference current 234. Still for a third example, if the power difference 230 is negative, then the controller component 232 may decrease the previous reference current 234 by a given value in order to determine the new reference current 234.

In some examples, the given value includes a constant value, such as, but not limited to, 1 amp, 2 amps, 5, amps, and/or any other value. However, in other examples, the given value may not be constant. For instance, the given value may depend on the power difference 230. For example, the controller component 232 may determine the given value for increasing/decreasing the previous reference current 228 by multiplying the absolute value of the power difference 230 by a constant value. The constant value may include, but is not limited to, 0.1, 0.05, 1, and/or any other value. While this is just one example of determining the given value when the given value is not constant, in other examples, any other algorithm may be used to determine the constant value.

The circuit 202 may further include a feedback component 236 that is configured to regulate the input current 108 from the power source 104. In some instances, the feedback component 236 may include, but is not limited to, an amplifier (e.g., an operational amplifier, a differential amplifier, an instrumentation amplifier, an isolation amplifier, etc.). To regulate the input current 108, the feedback component 236 is configured to receive signals indicating the reference currents 234 from the controller component 232. The feedback component 236 may further receive signals indicating the input current 108 from a current sensor 238, which is represented by 240. For example, the current sensor 238 may be configured to determine the input current 108 being received by the power converter 204. The current sensor 238 may then send the signals indicating the input current 240 to the feedback component 236. The feedback component 236 may then use the reference current 234 and the input current 240 to regulate and/or maintain the constant input current 108.

For example, the circuit 202 may include a compensator component 242 that is configured to operate as a feedback compensator for the power converter 204. Since the circuit 202 includes a closed loop feedback control design, the input current 108 from the power source 104 will follow the reference current 234 determined by the controller component 232. For a first example, if the controller component 232 increases the reference current 234, then the input current 108 will also increase to be approximately equal to the reference current 234. For a second example, if the controller component 232 decreases the reference current 234, then the input current 108 will also decrease to be approximately equal to the reference current 234. Still, for a third example, if the controller component 232 maintains a constant reference current 234, then the input current 108 will also remain constant.

The circuit 202 may also include a gain component 244 that is configured to convert the output from the feedback component 236 to a pulse width modulation (PWM) that can be used by the power converter 204.

In the example of FIG. 2, the circuit 202 is able to operate a constant input current 108 by causing the input current 108 to decrease, increase, or remain the same during the period of time. The circuit 202 may cause the input current to decrease, increase, or remain the same in order to cause the average output power 224 to be approximately equal to the reference power 228. For a first example, and if the average output power 224 is less than the reference power 228, then the controller component 232 will increase the reference current 234, which will also cause the input current 108 to increase. By increasing the input current 108, the average output power 224 will also increase to be closer to and/or equal to the reference power.

Figure 3:
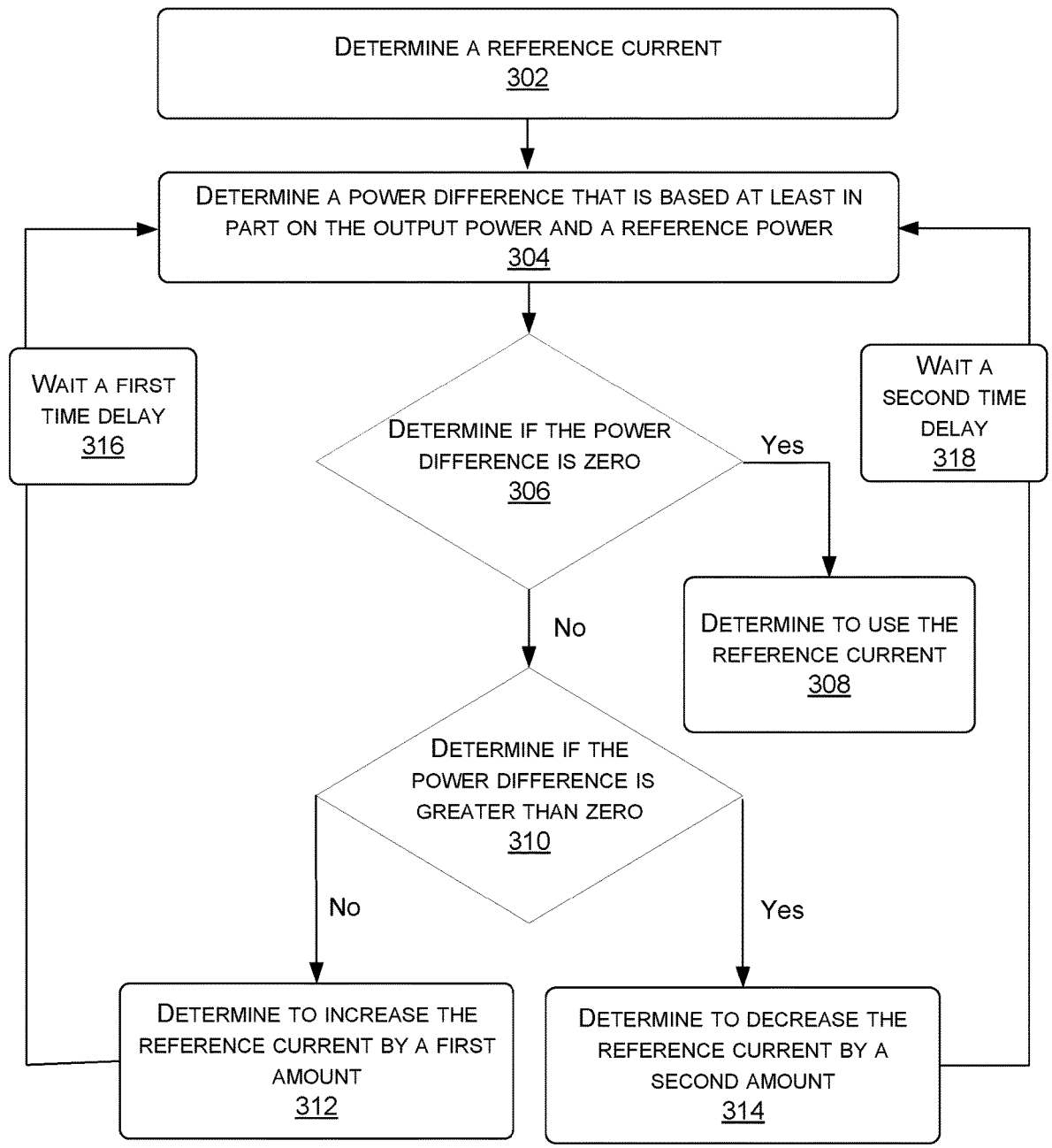
FIG. 3 illustrates a first example process for regulating power using a control device, according to various aspects of the present disclosure.
Figure 4:
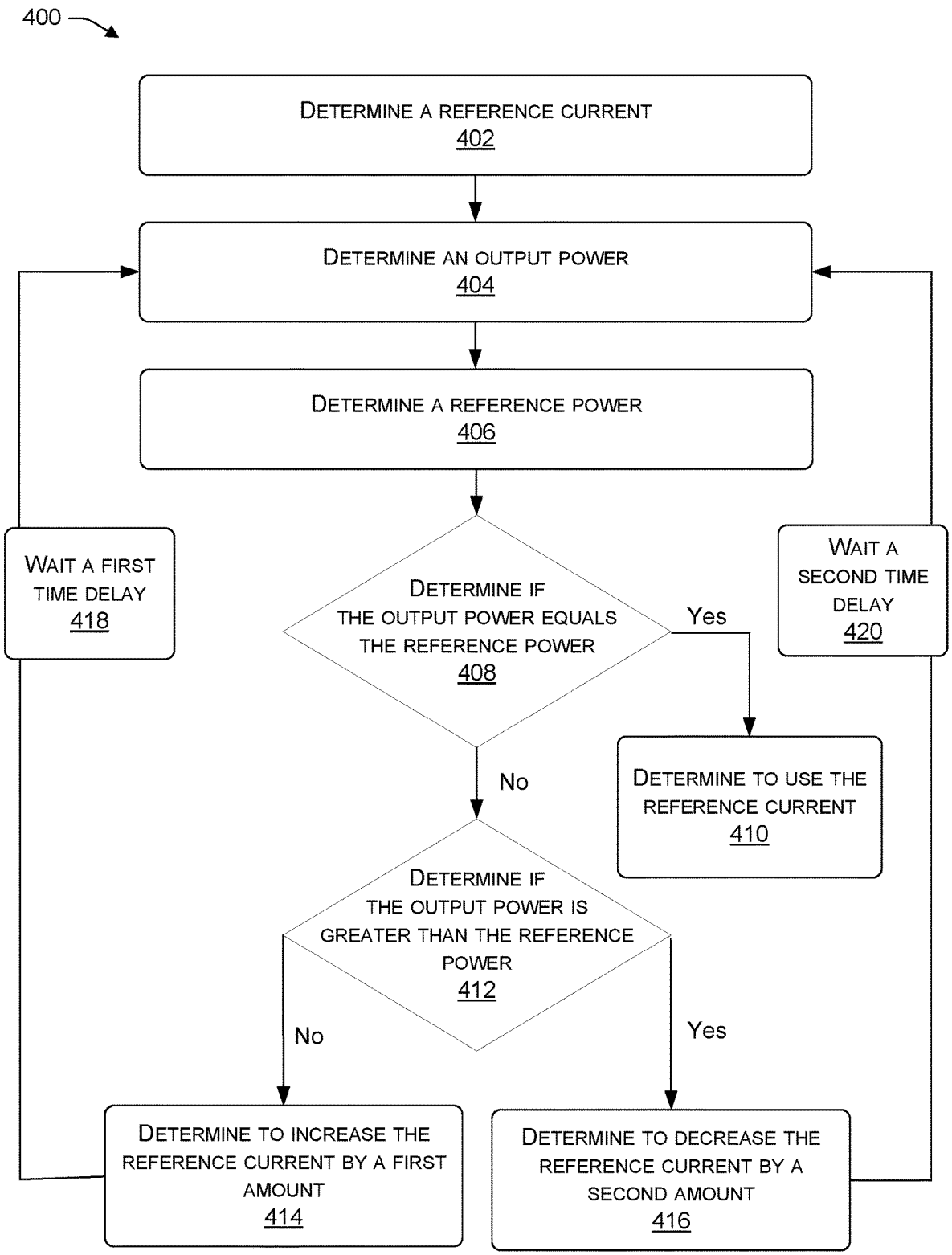
FIG. 4 illustrates a second example process for regulating power using a control device, according to various aspects of the present disclosure.
Figure 5:
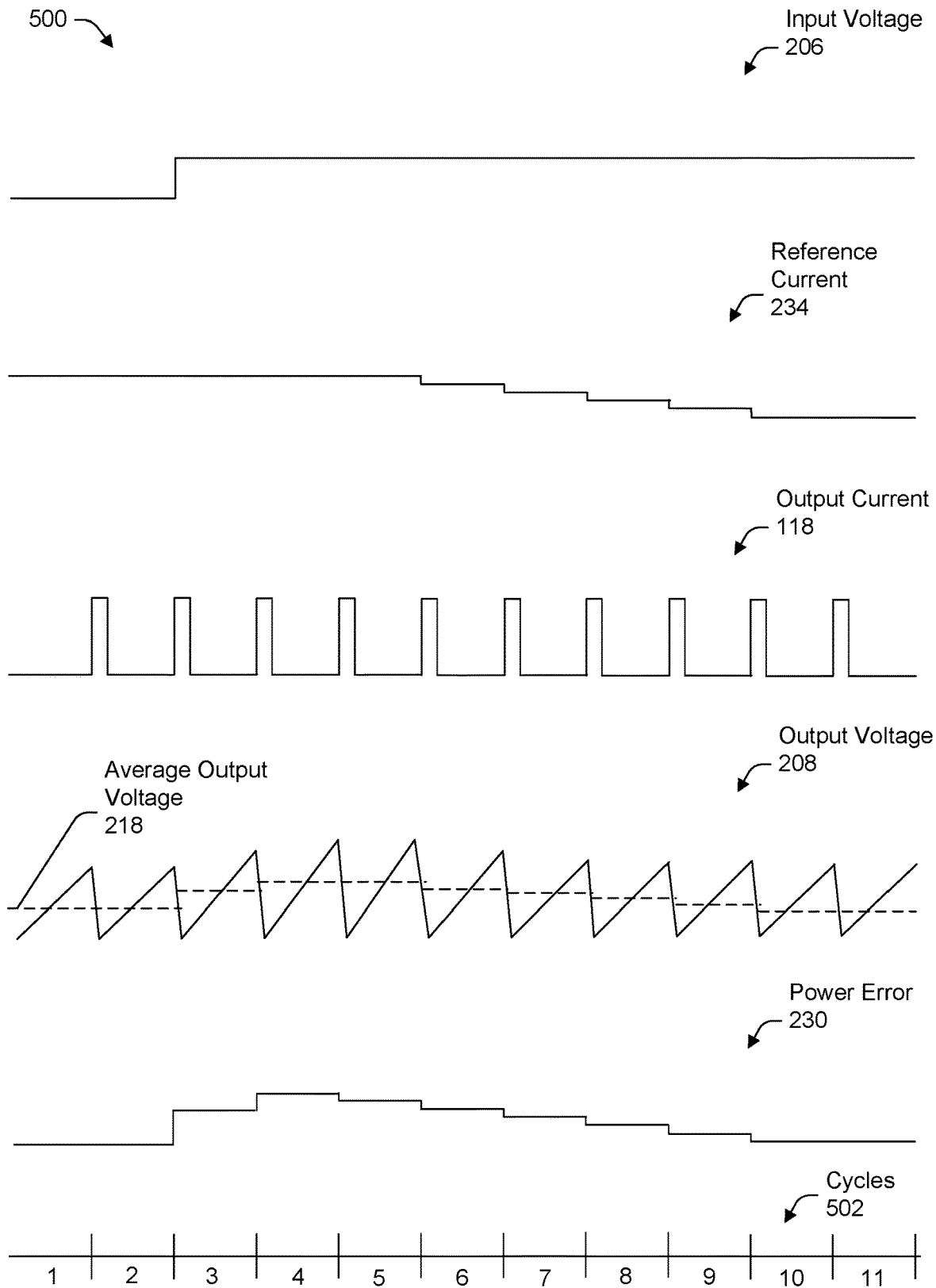
FIG. 5 illustrates example waveforms associated with regulating power using a control device, according to various aspects of the present disclosure.

For a second example, and if the average output power 224 is greater than the reference power 228, then the controller component 232 will decrease the reference current 234, which will also cause the input current 108 to decrease. By decreasing the input current 108, the average output power 224 will also decrease to be closer to and/or equal to the reference power. Still, for a third example, and if the average output power 224 is equal to the reference power 228, then the controller component 232 will not change the reference current 234, which will also cause the input current 108 to remain constant. By keeping the input current 108 constant, the average output power 224 will also remain equal to the reference power 228. Examples of regulating the power using the control device 102 is illustrated in the examples of FIGS. 3-5.

It should be noted that the example of FIG. 2 illustrates example locations for the current sensor 238, the current sensor 210, and the voltage sensor 212. However, in other examples, one or more of the current sensor 238, the current sensor 210, and the voltage sensor 212 may be located at different locations within the circuit 202.

It should also be noted that the example of FIG. 2 illustrates the averaging component 214 attached to the current sensor 210 and the averaging component 218 attached to the voltage sensor 212, however, in other examples, the averaging component 214 and/or the averaging component 218 may be located at different locations within the circuit 202. Additionally, in other examples, the circuit 202 may only include a single averaging component. For a first example, the circuit 202 may include an averaging component that is located after the power component 222 and averages the output power. For a second example, the circuit 202 may include an averaging component that is located after the amplifier 226 and averages the power difference 230. Still, for a third example, the controller component 232 may include an averaging component that averages the output current 118, the output voltage 208, and/or the output power.

It should further be noted that, in some examples, the controller component 232 may include one or more of the averaging component 214, the averaging component 218, the power component 222, the amplifier component 226, and/or the feedback component 236. For example, the one or more of the averaging component 214, the averaging component 218, the power component 222, the amplifier component 226, and/or the feedback component 236 may include software stored and executed by the controller component 232.

Figure 7:
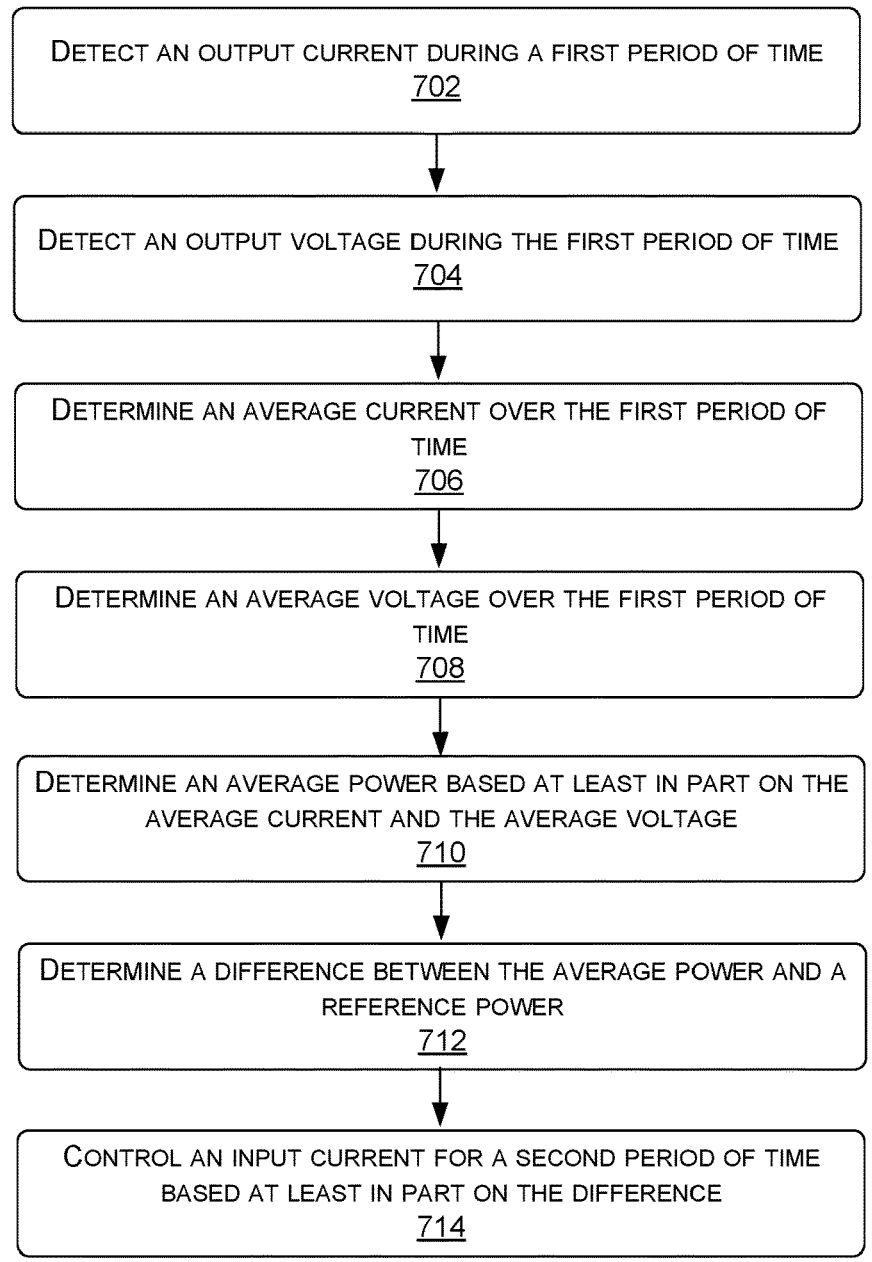
FIG. 7 illustrates an example process of regulating output power using a reference power, according to various aspects of the present disclosure.

FIGS. 3, 4, and 7 illustrate various processes for regulating power using the control device 102. The processes described herein are illustrated as collections of blocks in logical flow diagrams, which represent a sequence of operations, some or all of which may be implemented in hardware, software or a combination thereof. In the context of software, the blocks may represent computer-executable instructions stored on one or more computer-readable media that, when executed by one or more processors, program the processors to perform the recited operations. Generally, computer-executable instructions include routines, programs, objects, components, data structures and the like that perform particular functions or implement particular data types. The order in which the blocks are described should not be construed as a limitation, unless specifically noted. Any number of the described blocks may be combined in any order and/or in parallel to implement the process, or alternative processes, and not all of the blocks need be executed.

FIG. 3 illustrates a first example process 300 for regulating power using the control device 102, according to various aspects of the present disclosure. In some instances, the process 300 of FIG. 3 may occur when at least the power component 222 and the amplifier component 226 are separate from the controller component 232.

At 302, the process 300 may include determining a reference current. For instance, the controller component 232 may determine the reference current 234. In some instances, the reference current 234 is approximately equal to the input current 108. For instance, the controller component 232 may use the reference current 234 in order to regulate the input current 108 being received by the power converter 204. For example, the controller component 232 can cause the input current 108 to decrease by decreasing the reference current 302, cause the input current 108 to remain the same by not altering the reference current 232, and/or cause the input current 108 to increase by increasing the reference current 232.

At 304, the process 300 may include determining a power difference that is based at least in part on an output power and a reference power. For instance, the controller component 232 may receive a signal from the amplifier component 226, where the signal represents the power difference 230. In such an instance, the amplifier component 226 may have determined the power difference 230 using at least the average output power 224 and the reference power 228. The controller component 232 may receive the signal representing the power difference 230 at the elapses of a period of time. For example, and as will be described below, the example process 300 may repeat such that the controller component 232 receives signals representing the power differences 230 when periods of time elapse.

At 306, the process 300 may include determining if the power difference is zero. For instance, the controller component 232 may analyze the power difference 230 to determine if the power difference 230 is zero. If, at 306, it is determined that the power difference 230 is equal to zero, then at 308, the process 300 may include determining to use the reference current. For instance, if the controller component 232 determines that the power difference 230 is zero, then the controller component 232 may determine to use the same reference current 234. This may be because the average output current 220 is equal to the reference power 228 and as such, the output current 118 should remain the same. The controller component 232 may then output a signal indicating the reference current 234. Additionally, in some instances, the example process 300 may repeat back at 304 after a time delay (similar to the processes described below).

However, if, at 306, it is determined that the power difference is not zero, then at 310, the process 300 may include determining if the power difference is greater than zero. For instance, if the controller component 232 determines that the power difference 230 is not equal to zero, then the controller component 232 may determine if the power difference 230 is greater than zero. In some instances, the controller component 232 may determine if the power difference 230 is greater than zero in order to determine whether to increase the input current 108 being received by the power converter 204 or decrease the input current 108 being received by the power converter 204.

For example, if, at 310, it is determined that the power difference is not greater than zero, then at 312, the process 300 may include determining to increase the reference current by a first amount. For instance, if the controller component 232 determines that the power difference 230 is less than zero, then the controller component 232 may determine that more output power is needed. As such, the controller component 232 may determine to increase the reference current 234 by the first amount and send a signal representing the increased reference current 234. By increasing the reference current 234, the controller component 232 may also cause the input current 108 to increase, which may also cause the output current 118 and/or the output voltage 208 to increase. As such, the average output power 224 will also increase to be closer to and/or the same as the reference power 228.

However, if, at 310, it is determined that the power difference 308 is greater than zero, then at 314, the process 300 may include determining to decrease the reference current by a second amount. For instance, if the controller component 232 determines that the power difference 230 is greater than zero, then the controller component 232 may determine that less output power is needed. As such, the controller component 232 may determine to decrease the reference current 234 and send a signal representing the decreased reference current 234. By decreasing the reference current 234, the controller component 232 may also cause the input current 108 and/or the output voltage 208 to decrease. As such, the average output power 224 will also decrease to be closer to and/or the same as the reference power 228.

As also shown in the example of FIG. 3, the process 300 may repeat back at 304 after altering the reference current. For a first example, after determining to increase the reference current at 312, and at 316, the process 300 may include waiting a first time delay and then repeating the process 300 starting at 304. For a second example, after determining to decrease the reference current at 314, and at 318, the process 300 may include waiting a second time delay and then repeating the process 300 starting at 304. In some instances, the first time delay of 316 may be the same as the second time delay of 318. In other examples, the first time delay of 316 may be different that the second time delay of 318.

In other words, the controller component 232 may continue to perform the process 300 in order to cause the average output power 224 to be equal to the reference power 228. Even when this occurs, such as at 308, the controller component 232 may still perform the process 300 in order to ensure that the average output power 224 remains equal to the reference power 228.

It should be noted that, in examples where the amplifier component 226 includes a comparator, the example process 300 of FIG. 3 may not include 306. For example, the controller component 232 may receive the power difference 230 indicating whether the average output power 224 is less than or greater than the reference power 228. As such, the example process 300 may move from 304 to 310.

FIG. 4 illustrates a second example process 400 for regulating power using the control device 102, according to various aspects of the present disclosure. In some instances, the process 400 of FIG. 4 may occur when the controller component 232 includes both the power component 222 and the amplifier component 226.

At 402, the process 400 may include determining a reference current. For instance, the controller component 232 may determine the reference current 234. In some instances, the reference current 234 is approximately equal to the input current 108. For instance, the controller component 232 may use the reference current 234 in order to regulate the input current 108 being received by the power converter 204. For example, the controller component 232 can cause the input current 108 to decrease by decreasing the reference current 302, cause the input current 108 to remain the same by not altering the reference current 232, and/or cause the input current 108 to increase by increasing the reference current 232.

At 404, the process 400 may include determining an output power. For instance, the controller component 232 may receive a signal representing the average output current 216 from the first averaging component 214 and receive a signal representing the average output voltage 220 from the second averaging component 218. The controller component 232 may then determine the average output power 224 using the average output current 216 and the average output voltage 220. For example, the controller component 232 may determine the average output power 224 by multiplying the average output current 216 by the average output voltage 220.

It should be noted that, in other examples, rather than receiving the average output current 216 and the average output voltage 220, the controller component 232 may receive the output current 118 from the current sensor 210 and the output voltage 208 from the voltage sensor 212. The controller component 232 may then determine the output power over a period of time using the output current 118 and the output voltage 208. Additionally, the controller component 232 may include an averaging component that determines the average output power 224 using the output power over the period of time.

At 406, the process 400 may include determining a reference power. For instance, the controller component 232 may receive a signal representing the reference power 228. In some instances, the reference power 228 used by the controller component 232 may be constant. However, in other instances, the reference power 228 used by the controller component 232 may change over time.

At 408, the process 400 may include determining if the output power equals the reference power. For instance, the controller component 232 may compare the average output power 224 to the reference power 228 in order to determine if the average output power 224 is equal to the reference power 228. If, at 408, it is determined that the average output power 224 is equal to the reference power 228, then at 410, the process 400 may include determining to use reference current. For instance, if the controller component 232 determines that the average output power 224 is equal to the reference power 228, then the controller component 232 may determine to use the same reference current 234. The controller component 232 may then output a signal indicating the reference current 234.

However, if, at 408, it is determined that the output power does not equal the reference power, then at 412, the process 400 may include determining if the output power is greater than the reference power. For instance, if the controller component 232 determines that the average output power 224 does not equal to the reference power 228, then the controller component 232 may determine if the average output power 224 is greater than the reference power 228. In some instances, the controller component 232 may determine if the average output power 224 is greater than the reference power 228 in order to determine whether to increase the input current 108 being received by the power converter 204 or decrease the input current 108 being received by the power converter 204.

For example, if, at 412, it is determined that the output power is not greater than the reference power, then at 414, the process 400 may include determining to increase the reference current by a first amount. For instance, if the controller component 232 determines that the average output power 224 is not greater than the reference power 228, then the controller component 232 may determine that more output power is needed. As such, the controller component 232 may determine to increase the reference current 234 and send a signal representing the increased reference current 234. By increasing the reference current 234, the controller component 232 may also cause the input current 108 to increase, which also causes the output current 118 and/or the output voltage 208 to increase. As such, the average output power 224 will also increase to be closer to and/or the same as the reference power 228.

However, if, at 412, it is determined that the average output power is greater than the reference power, then at 416, the process 400 may include determining to decrease the reference current by a second amount. For instance, if the controller component 232 determines that the average output power 224 is greater than the reference power 228, then the controller component 232 may determine that less output power is needed. As such, the controller component 232 may determine to decrease the reference current 234 and send a signal representing the decreased reference current 234. By decreasing the reference current 234, the controller component 232 may also cause the input current 108 to decrease, which also causes the output current 118 and/or the output voltage to decrease. As such, the average output power 224 will also decrease to be closer to and/or the same as the reference power 228.

As also shown in the example of FIG. 4, the process 400 may repeat back at 404 after altering the reference current. For a first example, after determining to increase the reference current at 414, and at 418, the process 400 may include waiting a first time delay and then repeating the process 400 starting at 404. For a second example, after determining to decrease the reference current at 416, and at 420, the process 400 may include waiting a second time delay and then repeating the process 400 starting at 404. In some instances, the first time delay of 418 may be similar to the second time delay of 420. In other examples, the first time delay of 418 may be different that the second time delay of 420.

In other words, the controller component 232 may continue to perform the process 400 in order to cause the average output power 224 to be equal to the reference power 228. Even when this occurs, such as at 410, the controller component 232 may still perform the process 400 in order to ensure that the average output power 224 remains equal to the reference power 228.

FIG. 5 illustrates example waveforms 500 associated with regulating power using the control device 102, according to various aspects of the present disclosure. As shown, FIG. 5 illustrates how the waveforms change over eleven cycles 502 associated with the control device 102.

For example, there may be steady operations during cycles 1 and 2. As such, the input voltage 206 from the power source 104 and the reference current 234 remain constant. Additionally, the average output voltage 220 remains constant while the output current 118 pulses constantly at each cycle. Furthermore, the power difference 230 may be equal to zero during cycles 1 and 2.

In the example of FIG. 5, the input voltage 206 may be perturbed at the beginning of cycle 3. This may cause the control device 102 to respond between cycle 3 and cycle 9. For example, and as shown, the average output voltage 220 increases during cycle 3 and cycle 4. Since the output current 118 remains the same, the increase in the average output voltage 220 causes the average output power 224 to also increase. This causes the power difference 230 to also increase and be greater than zero. Since the power difference 230 is now greater than zero, the control device 102 may begin causing the reference current 234 to decrease starting at the beginning of cycle 5.

By decreasing the reference current 234, the average output voltage 220 also starts decreasing at the beginning of cycle 5. Since the output current 118 still remains the same, the decrease in the average output voltage 220 causes the average output power 224 to also decrease between cycle 5 and cycle 9. Additionally, this causes the power difference 230 to decrease between cycle 5 and cycle 9. At the end of cycle 9, the power difference 230 may again be equal to zero. As such, the control device 102 may cause the reference current 234 to once again stay constant.

In the example of FIG. 5, there may again be steady operations after the beginning of cycle 10. As such, the input voltage 206 from the power source 104 and the reference current 234 remain constant. Additionally, the average output voltage 220 remains constant while the output current 118 pulses constantly at each cycle. Furthermore, the power difference 230 may remain equal to zero.

Figure 6:
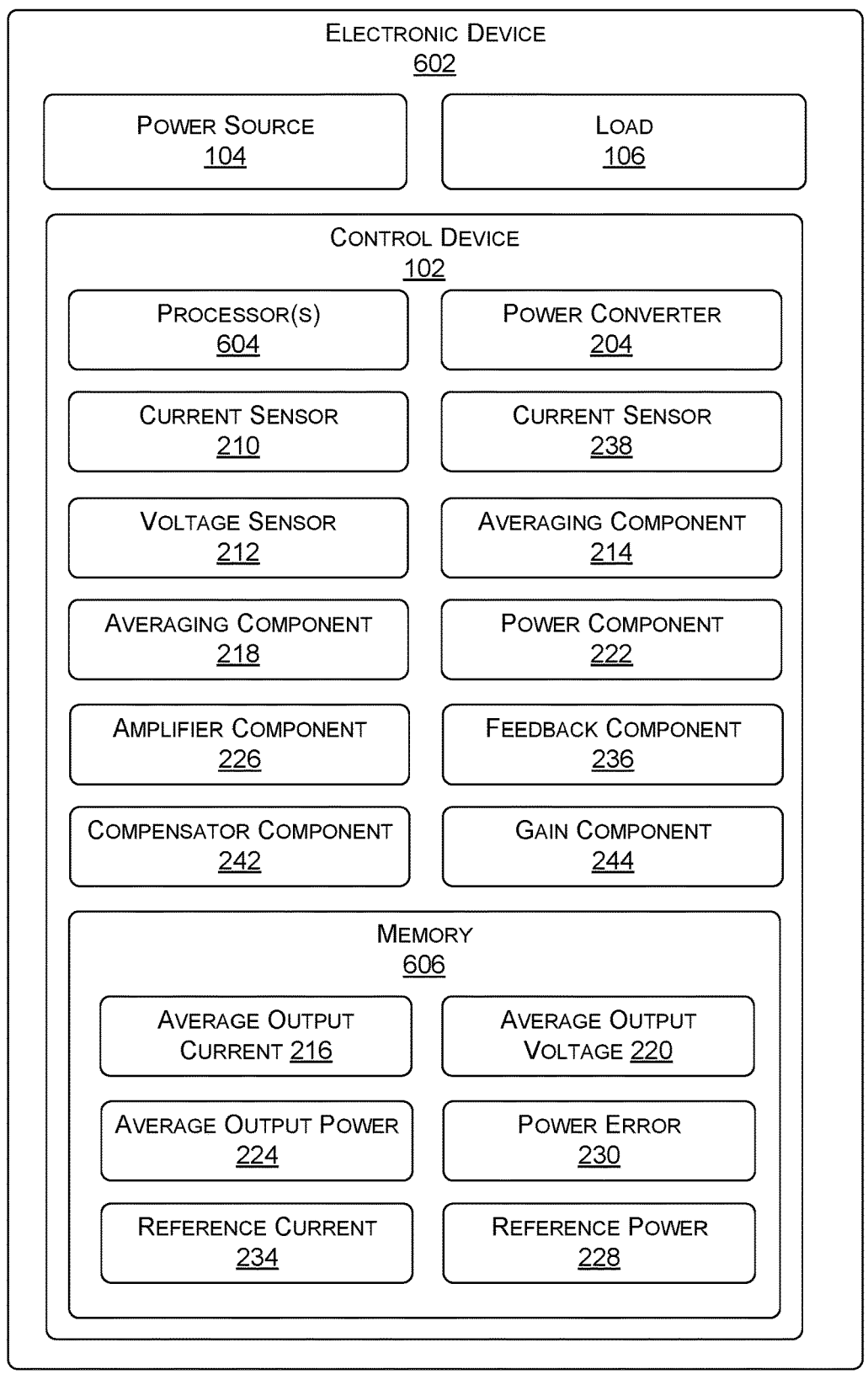
FIG. 6 illustrates an example electronic device that includes the control device from the example of FIG. 1, according to various aspects of the present disclosure.

FIG. 6 illustrates an example electronic device 602 that includes the control device 102, according to various aspects of the present disclosure. The electronic device 602 may include, but is not limited to, a computer, a camera, a lighting device, a sensor, a tablet, a mobile phone, and/or any other type of device. As shown in the example of FIG. 6, the electronic device 602 may include the control device 102, the power source 104, and the load 106. However, in other examples, the electronic device 602 may not include the power source 104 and/or the load 106. Additionally, in other examples, the electronic device 602 may include more than one load.

The control device 102 includes all of the components included in the example circuit 202 of FIG. 2 (e.g., where processor(s) 604 represent the controller component 232). However, in other examples, the control device 102 may not include one or more of the components illustrated in FIG. 6 and/or may include one or more additional components not illustrated in the example of FIG. 6. Additionally, in some examples, one or more of the components may be combined into a single component. Furthermore, in some examples, one or more of the components may include software components that are also stored within memory 606.

In the example of FIG. 6, the electronic device 602 further includes the processor(s) 604 and memory 606. As used herein, a processor, such as the processor(s) 604, may include multiple processors and/or a processor having multiple cores. Further, the processors may comprise one or more cores of different types. For example, the processors may include application processor units, graphic processing units, and so forth. In one instance, the processor may comprise a microcontroller and/or a microprocessor. The processor(s) may include a graphics processing unit (GPU), a microprocessor, a digital signal processor or other processing units or components known in the art. Alternatively, or in addition, the functionally described herein can be performed, at least in part, by one or more hardware logic components. For example, and without limitation, illustrative types of hardware logic components that can be used include field-programmable gate arrays (FPGAs), application-specific integrated circuits (ASICs), application-specific standard products (ASSPs), system-on-a-chip systems (SOCs), complex programmable logic devices (CPLDs), etc. Additionally, each of the processor(s) may possess its own local memory, which also may store program components, program data, and/or one or more systems.

Memory, such as the memory 606, may include volatile and nonvolatile memory, removable and non-removable media implemented in any method or technology for storage of information, such as computer-readable instructions, data structures, program component, or other data. The memory includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, RAID storage systems, or any other medium which can be used to store the desired information and which can be accessed by a computing device. The memory may be implemented as computer-readable storage media ("CRSM"), which may be any available physical media accessible by the processor(s) to execute instructions stored on the memory. In one basic instance, CRSM may include random access memory ("RAM") and Flash memory. In other instances, CRSM may include, but is not limited to, read-only memory ("ROM"), electrically erasable programmable read-only memory ("EEPROM"), or any other tangible medium which can be used to store the desired information and which can be accessed by the processor(s).

Further, functional components may be stored in the respective memories, or the same functionality may alternatively be implemented in hardware, firmware, application specific integrated circuits, field programmable gate arrays, or as a system on a chip (SoC). In addition, while not illustrated, each respective memory discussed herein may include at least one operating system (OS) component that is configured to manage hardware resource devices such as the network interface(s), the I/O devices of the respective apparatuses, and so forth, and provide various services to applications or components executing on the processors. Such OS component may implement a variant of the Free-BSD operating system as promulgated by the FreeBSD Project: other UNIX or UNIX-like variants; a variation of the Linux operating system as promulgated by Linus Torvalds; the FireOS operating system from Amazon.com Inc. of Seattle, Washington, USA: the Windows operating system from Microsoft Corporation of Redmond, Washington, USA: LynxOS as promulgated by Lynx Software Technologies, Inc. of San Jose, California: Operating System Embedded (Enea OSE) as promulgated by ENEA AB of Sweden: and so forth.

While the foregoing invention is described with respect to the specific examples, it is to be understood that the scope of the invention is not limited to these specific examples. Since other modifications and changes varied to fit particular requirements and environments will be apparent to those skilled in the art, the invention is not considered limited to the example chosen for purposes of disclosure, and covers all changes and modifications which do not constitute departures from the true spirit and scope of this invention.

Although the application describes embodiments having specific structural features and/or methodological acts, it is to be understood that the claims are not necessarily limited to the specific features or acts described. Rather, the specific features and acts are merely illustrative some embodiments that fall within the scope of the claims.

FIG. 7 illustrates an example process 700 of regulating output power using a reference power, according to various aspects of the present disclosure. At 702, the process 700 may include detecting an output current during a first period of time and at 704, the process 700 may include determining an output voltage during the first period of time. For instance, the control device 102 may detect the output current and the output voltage. In some instances, the control device 102 detects the output current using a current sensor located between the control device 102 and a load. Additionally, the control device 102 detects the output voltage using a voltage sensor located between the control device 102 and the load.

At 706, the process 700 may include determining an average current over the first period of time and at 708, the process 700 may include determining an average voltage over the first period of time. For instance, the control device 102 may determine the average current and the average voltage. In some instances, the control device 102 is configured to determine average currents and average voltages associated with the output power at the elapses of periods of time. For example, the control device 102 may be configured to determine a respective average currents and a respective average voltages at each cycle.

At 710, the process 700 may include determining an average power based at least in part on the average current and the average voltage. For instance, the control device 102 may determine the average power by multiplying the average current by the average voltage. In some instances, the control device 102 determines the average power using a multiplier. In some instances, the control device 102 is configured to determine the average power at the elapses of the periods of time. For example, the control device 102 may be configured to determine a respective average power at each cycle.

At 712, the process 700 may include determining a difference between the average power and a reference power. For instance, the control device 102 may determine the difference between the average power and the reference power. For a first example, the control device 102 may determine that the difference includes a negative power when the average power is less than the reference power. For a second example, the control device 102 may determine that the difference includes zero when the average power is equal to the reference power. Still, for a third example, the control device 102 may determine that the difference includes a positive power when the average power is greater than the reference power.

At 714, the process 700 may include controlling an input current for a second period of time based at least in part on the difference. For instance, the control device 102 may control the input current based on the difference. For a first example, if the difference includes a negative power, then the control device 102 may control the input current by causing the input current to increase. For a second example, if the difference includes zero, then the control device 102 may control the input current by causing the input current to remain constant. Still, for a third example, if the difference includes a positive power, then the control device 102 may control the input current by causing the input current to decrease.

In some instances, the control device 102 controls the input current using signals. For a first example, if the control device 102 determines to increase the input current, the control device 102 may then determine a new reference current that is greater than a current reference current. The control device 102 then outputs a signal representing the new reference current. For a second example, if the control device 102 determines to keep the input current constant, the control device 102 may then determine a new reference current that is similar to a current reference current. The control device 102 then outputs a signal representing the new reference current. Still, for a third example, if the control device 102 determines to decrease the input current, the control device 102 may then determine a new reference current that is less than a current reference current. The control device 102 then outputs a signal representing the new reference current.

What is claimed is:

1. An electronic device comprising:
   at least one battery;
   a load; and
   a control device located between the at least one battery and the load, the control device comprising:
   a power converter configured to:
   receive a first current from the at least one battery during a first period of time, the first current being approximately constant; and
   transmit a second current to the load during the first period of time, the second current including a pulsing current;
   a current sensor configured to detect the second current being transmitted by the power converter;
   a voltage sensor configured to detect a voltage being output by the power converter;
   one or more processors; and
   one or more non-transitory computer-readable media storing instructions that, when executed by the one or more processors, cause the one or more processors to perform operations comprising:
   determining an average power that is output by the power converter during the first period of time, the average power being based at least in part on the second current and the voltage;
   determining a reference power associated with the load;
   determining that the reference power is greater than the average power; and
   based at least in part on the reference power being greater than the average power, causing the first current being received by the power converter to increase to a third current during a second period of time.

2. The electronic device as recited in claim 1, wherein the average output is a first average output, and wherein the operations further comprise:
   determining a second average power that is output by the power converter during the second period of time;
   determining that the second average power is greater than the reference power; and
   based at least in part on the second average power being greater than the reference power, causing the third current being received by the power converter to decrease to a fourth current during a fourth period of time.

3. The electronic device as recited in claim 1, wherein causing the first current to increase to the second current during the second period of time comprises transmitting a signal representing a reference current, the reference current being approximately equal to the third current.

4. An electronic device comprising:
   a power converter configured to:
   receive a first current from a power source during a first period of time, the first current being approximately constant; and
   transmit a second current to a load during the first period of time, the second current being a pulsing current;
   one or more processors; and
   one or more non-transitory computer-readable media storing instructions that, when executed by the one or more processors, cause the one or more processors to perform operations comprising:
   determining a difference between an average power output by the power converter during the first period of time and a reference power, the average power being based at least in part on the second current; and
   based at least in part on the difference between the average power and the reference power, causing the power converter to adjust the first current to a third current from the power source during a second period of time.

5. The electronic device as recited in claim 4, wherein:
   determining the difference between the average power and the reference power comprises determining that the average power is greater than the reference power; and
   causing the power converter to receive the third current from the power source comprises causing the power converter to receive, from the power source, the third current that is less than the first current for the second period of time.

6. The electronic device as recited in claim 4, wherein:
   determining the difference between the average power and the reference power comprises determining that the average power is less than the reference power; and
   causing the power converter to receive the third current from the power source comprises causing the power converter to receive, from the power source, the third current that is greater than the first current for the second period of time.

7. The electronic device as recited in claim 4, wherein:
   determining the difference between the average power and the reference power comprises determining that the average power is equal to the reference power; and causing the power converter to receive the third current from the power source comprises causing the power converter to receive, from the power source, the third current that is equal to the first current for the second period of time.

8. The electronic device as recited in claim 4, wherein the average power is a first average power and the difference is a first difference, and wherein the operations further comprise, after causing the power converter to receive the third current from the power source:
  determining a second difference between a second average power output by the power converter and the reference power, the second difference being different than the first difference; and
  based at least in part on the second difference between the second average power and the reference power, causing the power converter to receive fourth current from the power source for a third period of time.

9. The electronic device as recited in claim 4, further comprising:
  a multiplier component configured to determine the average power during the period of time; and
  a comparator component configured to determine the difference between the average power and the reference power, wherein determining the difference between the average power and the reference power comprises receiving, from the comparator component, a signal that indicates the difference.

10. The electronic device as recited in claim 4, the operations further comprising:
  determining an average of the second current during the first period of time;
  determining an average voltage being output by the power converter during the first period of time; and
  determining the average power based at least in part on the average of the second current and the average voltage.

11. The electronic device as recited in claim 4, the operations further comprising causing an average input power being received from the power source to be approximately equal to the average output power being transmitted to the load.

12. The electronic device as recited in claim 4, the operations further comprising:
  outputting a first signal representing a first reference current, the first reference current being approximately equal to the first current:
  based at least in part on the difference between the average power and the reference power, determining a second reference current by increasing or decreasing the first reference current; and
  outputting a second signal representing the second reference current, the second reference current being approximately equal to the third current.

13. The electronic device as recited in claim 12, the operations further comprising determining an amount to increase or decrease the first reference current based at least in part on the difference between the average power and the reference power.

14. The electronic device as recited in claim 4, wherein the average power is a first average power and the reference power is a first reference power, and wherein the operations further comprise:
  determining a second reference power, the second reference power being associated with a change in power for the load;
  determining a difference between a second average power output by the power converter and the second reference power; and
  based at least in part on the difference between the second average power and the second reference power, causing the power converter to receive a fourth current from the power source for a third period of time.

15. The electronic device as recited in claim 4, the operations further comprising determining the second period of time based at least in part on the difference between the average power and the reference power.

16. A system comprising:
  a power converter configured to receive a first current from a power source during a first period of time and deliver a second current to a load, the first current being approximately constant and the second current being a pulsing current;
  one or more processors; and
  one or more non-transitory computer-readable media storing instructions that, when executed by the one or more processors, cause the one or more processors to perform operations comprising:
    determining a difference between an average power output by the power converter during the first period of time and a reference power, the average power being based at least in part on the second current; and
    based at least in part on the difference between the average power and the reference power, causing the power converter to adjust the first current to a third current during a second period of time.

17. The system of claim 16, wherein:
determining the difference between the average power and the reference power comprises determining that the average power is greater than the reference power; and
causing the power converter to receive the third current from the power source comprises causing the power converter to receive, from the power source, the third current that is less than the first current for the second period of time.

18. The system of claim 16, wherein:
determining the difference between the average power and the reference power comprises determining that the average power is less than the reference power; and
causing the power converter to receive the third current from the power source comprises causing the power converter to receive, from the power source, the third current that is greater than the first current for the second period of time.

19. The system of claim 16, wherein:
determining the difference between the average power and the reference power comprises determining that the average power is equal to the reference power; and
causing the power converter to receive the third current from the power source comprises causing the power converter to receive, from the power source, the third current that is equal to the first current for the second period of time.

20. The system of claim 16, wherein the operations further comprise:
  determining a voltage being output by the power converter during the first period of time; and
  determining the average power output based at least in part on the second current and the voltage.

* * * * *